(12) United States Patent
Huang et al.

(10) Patent No.: US 11,355,569 B2
(45) Date of Patent: Jun. 7, 2022

(54) ACTIVE DEVICE SUBSTRATE COMPRISING SILICON LAYER AND MANUFACTURING METHOD THEREOF

(71) Applicant: Au Optronics Corporation, Hsinchu (TW)

(72) Inventors: Chen-Shuo Huang, Hsinchu (TW); Hung-Wei Li, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 17/000,370

(22) Filed: Aug. 24, 2020

(65) Prior Publication Data

US 2021/0175309 A1    Jun. 10, 2021

(30) Foreign Application Priority Data

Dec. 10, 2019   (TW) .................................. 108145124

(51) Int. Cl.

| | |
|---|---|
| *H01L 29/08* | (2006.01) |
| *H01L 27/32* | (2006.01) |
| *H01L 51/56* | (2006.01) |
| *H01L 27/12* | (2006.01) |
| *H01L 29/66* | (2006.01) |
| *H01L 29/786* | (2006.01) |

(52) U.S. Cl.
CPC ...... *H01L 27/3262* (2013.01); *H01L 27/3265* (2013.01); *H01L 27/3276* (2013.01); *H01L 51/56* (2013.01); *H01L 27/124* (2013.01); *H01L 27/127* (2013.01); *H01L 27/1225* (2013.01); *H01L 27/1251* (2013.01); *H01L 27/1255* (2013.01); *H01L 27/1288* (2013.01); *H01L 29/66757* (2013.01); *H01L 29/66969* (2013.01); *H01L 29/7869* (2013.01); *H01L 29/78675* (2013.01); *H01L 2227/323* (2013.01)

(58) Field of Classification Search
CPC ............. H01L 27/3262; H01L 27/1225; H01L 27/3276; H01L 51/56
USPC .......................................................... 257/40
See application file for complete search history.

(56) References Cited

U.S. PATENT DOCUMENTS

| | | | |
|---|---|---|---|
| 6,084,273 A | * | 7/2000 | Hirota ................ H03K 19/0027 257/368 |
| 10,615,188 B2 | | 4/2020 | Liu et al. |

(Continued)

FOREIGN PATENT DOCUMENTS

| | | |
|---|---|---|
| CN | 105789217 | 7/2016 |
| CN | 106876412 | 6/2017 |

(Continued)

*Primary Examiner* — Phuc T Dang
(74) *Attorney, Agent, or Firm* — JCIPRNET

(57) ABSTRACT

An active device substrate includes a substrate, a silicon layer, a first insulating layer, a first gate, a first dielectric layer, a first transfer electrode, a second transfer electrode, and a second dielectric layer. Two openings penetrate through the first dielectric layer and overlap the silicon layer. The first transfer electrode and the second transfer electrode are respectively located in the two openings. The second dielectric layer is located on the first transfer electrode and the second transfer electrode. Two first through-holes penetrate through the second dielectric layer. The first transfer electrode and the second transfer electrode are etch stop layers of the two first through-holes.

11 Claims, 16 Drawing Sheets

(56) References Cited

U.S. PATENT DOCUMENTS

| | | | |
|---|---|---|---|
| 2009/0020817 A1* | 1/2009 | Park | H01L 27/1108 257/351 |
| 2016/0099300 A1* | 4/2016 | Lee | H01L 27/124 257/40 |
| 2017/0207253 A1 | 7/2017 | Liu et al. | |

FOREIGN PATENT DOCUMENTS

| | | |
|---|---|---|
| TW | 200709421 | 3/2007 |
| TW | 201810436 | 3/2018 |

* cited by examiner

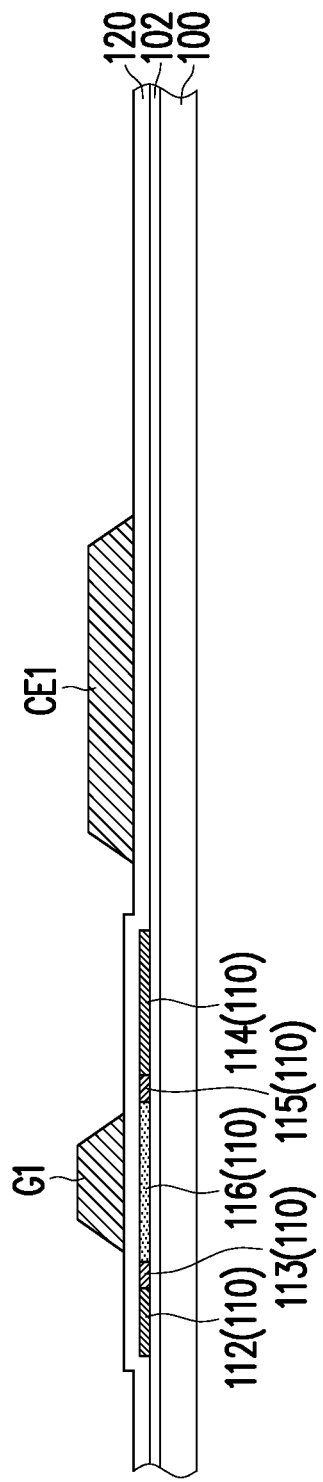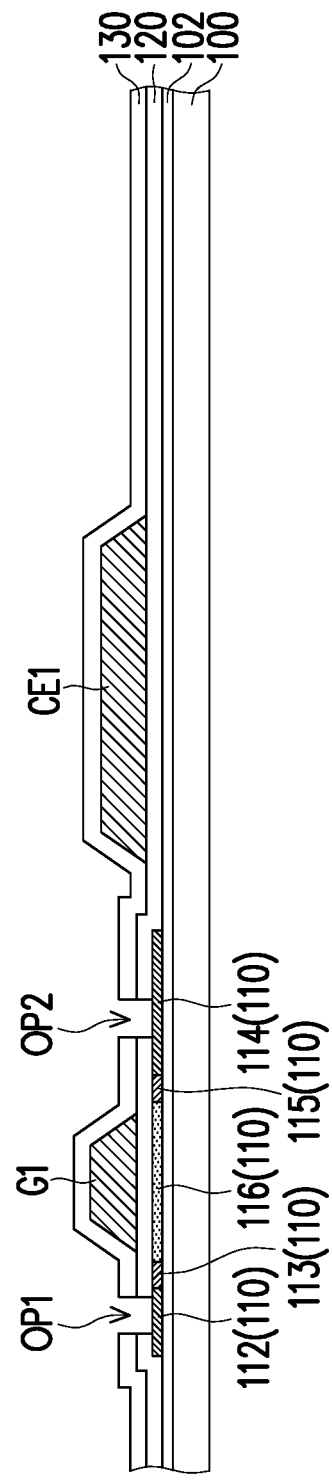

ACTIVE DEVICE SUBSTRATE COMPRISING SILICON LAYER AND MANUFACTURING METHOD THEREOF

CROSS-REFERENCE TO RELATED APPLICATION

This application claims the priority benefit of Taiwan application serial no. 108145124, filed on Dec. 10, 2019. The entirety of the above-mentioned patent application is hereby incorporated by reference herein and made a part of this specification.

BACKGROUND

Technical Field

The disclosure relates to an active device substrate, and in particular, to an active device substrate including a silicon layer and a manufacturing method thereof.

Description of Related Art

Display apparatuses usually include a large number of active devices. To satisfy different functional requirements, the display apparatuses may include one or more types of active devices. For example, in a display apparatus, to obtain better product performance, an active device located in a driver circuit may have an impedance different than that of an active device located in a pixel.

In the prior art, active devices having different impedances may be obtained by adjusting channel layer lengths or doping densities of channel layers of the active devices. However, it is difficult to satisfy all requirements by only adjusting the channel layer lengths of the active devices. Therefore, to form active devices greatly different from each other in terms of performance, a large number of process steps need to be added most of the time, resulting in a considerable increase in manufacturing costs of the display apparatuses.

SUMMARY

The disclosure provides an active device substrate to alleviate an over-etching problem of a silicon layer.

The disclosure provides a manufacturing method of an active device substrate to effectively alleviate a bad bridging problem caused by over-etching.

At least one embodiment of the disclosure provides an active device substrate. The active device substrate includes a substrate, a silicon layer, a first insulating layer, a first gate, a first dielectric layer, a first transfer electrode, a second transfer electrode, a second dielectric layer, a metal oxide channel layer, a second gate, a first source, a first drain, a second source, and a second drain. The silicon layer is located on the substrate. The first insulating layer is located on the silicon layer. The first gate is located on the first insulating layer. The first dielectric layer is located on the first gate. Two openings penetrate through at least the first dielectric layer, and the two openings overlap the silicon layer. The first transfer electrode and the second transfer electrode are respectively located in the two openings. The first transfer electrode and the second transfer electrode are respectively connected to the silicon layer. The second dielectric layer is located on the first transfer electrode and the second transfer electrode. Two first through-holes penetrate through at least the second dielectric layer. The first transfer electrode and the second transfer electrode are etch stop layers of the two first through-holes. The metal oxide channel layer is located above the second dielectric layer. The second gate overlaps the metal oxide channel layer. The first source and the first drain are located in the two first through-holes. The first source and the first drain are electrically connected to the first transfer electrode and the second transfer electrode respectively. The second source and the second drain are electrically connected to the metal oxide channel layer.

At least one embodiment of the disclosure provides a manufacturing method of an active device substrate, and the method includes the following steps. A silicon layer is formed on a substrate. A first insulating layer is formed on the silicon layer. A first gate is formed on the first insulating layer. A first dielectric layer is formed on the first gate. A first etching process is performed to form two openings penetrating through at least the first dielectric layer, and the two openings expose the silicon layer. A first transfer electrode and a second transfer electrode are formed in the two openings to connect the silicon layer. A second dielectric layer is formed on the first transfer electrode and the second transfer electrode. A second etching process is performed to form two first through-holes penetrating through at least the second dielectric layer, where the first transfer electrode and the second transfer electrode are etch stop layers of the two first through-holes. A metal oxide channel layer is formed above the second dielectric layer. A second gate is formed above the substrate. A first source and a first drain are formed in the two first through-holes respectively. A second source and a second drain are formed on the metal oxide channel layer.

At least one embodiment of the disclosure provides a manufacturing method of an active device substrate, and the method includes the following steps. A silicon layer is formed on a substrate. A first insulating layer is formed on the silicon layer. A first gate is formed on the first insulating layer. A first dielectric layer is formed on the first gate. A first etching process is performed to form two first through-holes penetrating through at least the first dielectric layer, and the two first through-holes expose the silicon layer. An oxide layer is formed above the first dielectric layer. and the oxide layer includes two guard electrodes and a metal oxide channel layer separated from the two guard electrodes. The two guard electrodes are respectively filled in the two first through-holes and are connected to the silicon layer. A first source and a first drain are formed on the two guard electrodes. A second source and a second drain are formed on the metal oxide channel layer.

BRIEF DESCRIPTION OF THE DRAWINGS

FIG. 1A to FIG. 1G are schematic cross-sectional views of a manufacturing method of a display apparatus according to an embodiment of the disclosure.

DESCRIPTION OF THE EMBODIMENTS

Figure 1C:
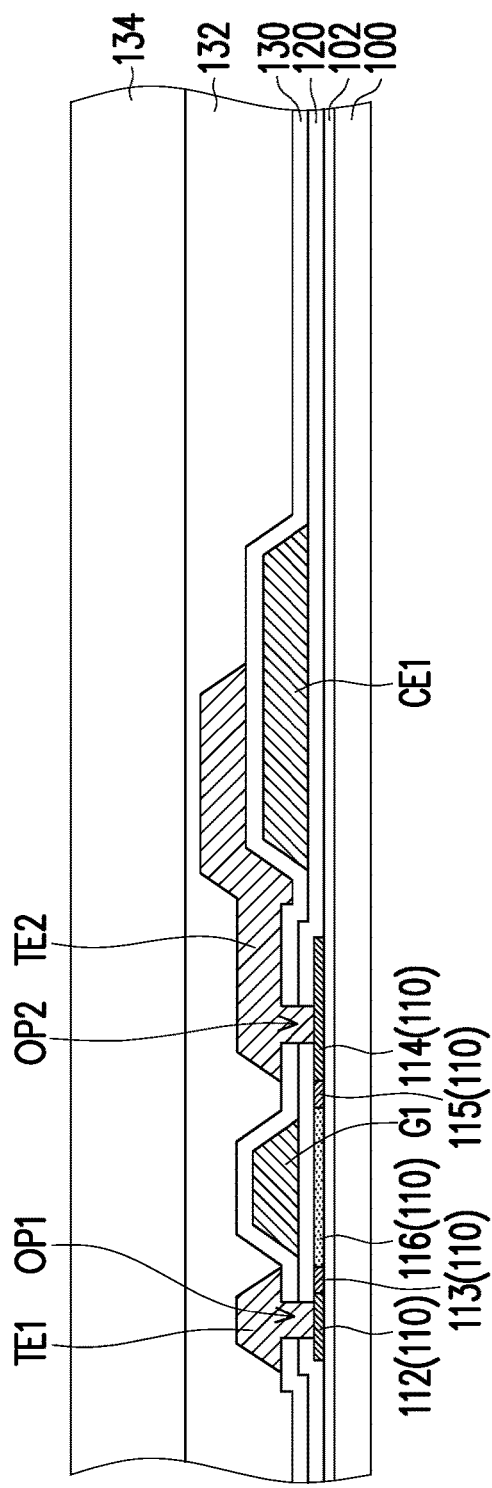

FIG. 1A to FIG. 1G are schematic cross-sectional views of a manufacturing method of a display apparatus according to an embodiment of the disclosure.

Referring to FIG. 1A, a substrate 100 is provided. Materials of the substrate 100 may include glass, quartz, organic polymer, an opaque/reflective material (for example, a conductive material, metal, wafer, ceramic, or another similar material), or another suitable material.

A silicon layer 110 is formed on the substrate 100. In some embodiments, an insulating layer 102 is selectively formed on the substrate 100, and then the silicon layer 110 is formed on the insulating layer 102. Materials of the insulating layer 102 may include silicon oxide. When the material of the substrate 100 is a conductive material or a metal, the insulating layer 102 may avoid a short circuit. In addition, the insulating layer 102 may also prevent the materials (for example, silicon nitride and glass impurities) of the substrate 100 from diffusing and prevent the silicon layer 110 from accumulating heat. The silicon layer 110 includes amorphous silicon, polycrystalline silicon, microcrystalline silicon, monocrystalline silicon, or a combination thereof. In this embodiment, the silicon layer 110 is, for example, low temperature poly-silicon (LIPS), and the silicon layer 110 includes two doped areas 112 and 114, a channel area 116 located between the two doped areas 112 and 114, and lightly doped areas 113 and 115 located between the two doped areas 112 and 114 and the channel area 116. In some embodiments, a doping density of the lightly doped areas 113 and 115 is less than a doping density of the doped areas 112 and 114.

A first insulating layer 120 is formed on the silicon layer 110. In this embodiment, the first insulating layer 120 covers a top surface and sidewalls of the silicon layer 110 and extends to a surface of the substrate 100. That is, the first insulating layer 120 is conformal to the substrate 100 and the silicon layer 110, but the disclosure is not limited thereto. In other embodiments, the first insulating layer may cover only the channel layer 116.

Materials of the first insulating layer 120 include an inorganic material (for example, silicon oxide, silicon nitride, silicon oxynitride, another suitable material or a stacked layer of at least two of the foregoing materials), an organic material, another suitable material, or a combination thereof. Herein, a thickness of the first insulating layer 120, for example, ranges from 10 nm to 200 nm. Within the thickness range, the first insulating layer 120 may have a better gate control capability and may prevent penetration of a gate current. In addition, with the thickness range, a process yield of the first insulating layer 120 is higher, and an active device corresponding to the silicon layer 110 can have better performance, but the disclosure is not limited thereto.

A first gate G1 and a capacitive electrode CE1 are formed on the first insulating layer 120. The first insulating layer 120 is located between the first gate G1 and the channel layer 116. An orthographic projection of the first gate G1 on the substrate 100 overlaps an orthographic projection of the silicon layer 110 on the substrate 100, and an orthographic projection of the capacitive electrode CE1 on the substrate 100 does not overlap the orthographic projection of the silicon layer 110 on the substrate 100.

In this embodiment, the first gate G1 and the capacitive electrode CE1 belong to a same film layer. For example, a metal material layer (not shown) is first formed on the first insulating layer 120, and then a lithographic etching process is performed on the metal material layer to form the first gate G1 and the capacitive electrode CE1, but the disclosure is not limited thereto. Materials of the first gate G1 and the capacitive electrode CE1 are, for example, a metal material, a nitride of a metal material, an oxide of a metal material, an oxynitride of a metal material, another suitable material, or a stacked layer of a metal material and another conductive material.

Referring to FIG. 1B, a first dielectric layer 130 is formed on the first gate G1. The first dielectric layer 130 covers the first gate G1, the capacitive electrode CE1 and the first insulating layer 120. The first gate G1 and the capacitive electrode CE1 are both located between the first insulating layer 120 and the first dielectric layer 130. Materials of the first dielectric layer 130 may include, for example, an inorganic material (for example, silicon oxide, silicon nitride, silicon oxynitride, another suitable material, or a stacked layer of at least two of the foregoing materials), an organic material, another suitable material, or a combination thereof, but the disclosure is not limited thereto.

A first etching process is performed to form two openings OP1 and OP2 penetrating through at least the first dielectric layer 130. In this embodiment, the opening OP1 penetrates through the first dielectric layer 130 and the first insulating layer 120 and exposes the doped area 112 of the silicon layer 110. The opening OP2 penetrates through the first dielectric layer 130 and the first insulating layer 120 and exposes the doped area 114 of the silicon layer 110. A thickness of the first dielectric layer 130, for example, ranges from 10 nm to 500 nm. Within the thickness range, the process yield of the first dielectric layer 130 is higher, and a storage capacitor corresponding to the first dielectric layer 130 may have better performance, but the disclosure is not limited thereto. In this embodiment, the openings OP1, OP2 need to penetrate through only the first dielectric layer 130 and the first insulating layer 120 having a thinner thickness. Therefore, it is easier to stop the etching of the first etching process on the silicon layer 110 without excessively damaging the silicon layer 110, to effectively alleviate a problem caused by over-etching.

Referring to FIG. 1C, a first transfer electrode TE1 and a second transfer electrode TE2 are formed on the first dielectric layer 130. The first transfer electrode TE1 and the second transfer electrode TE2 are filled in the two openings OP1 and OP2 respectively. The first transfer electrode TE1 is connected to the doped area 112 of the silicon layer 110, and the second transfer electrode TE2 is connected to the doped area 114 of the silicon layer 110.

In this embodiment, an orthographic projection of the second transfer electrode TE2 on the substrate 100 overlaps the orthographic projection of the capacitive electrode CE1 on the substrate 100, and the first dielectric layer 130 is sandwiched between the second transfer electrode TE2 and the capacitive electrode CE1. Therefore, there is a capacitor (for example, a storage capacitor) between the second transfer electrode TE2 and the capacitive electrode CE1.

In this embodiment, the first transfer electrode TE1 and the second transfer electrode TE2 are a same film layer. For example, a metal material layer (not shown) is first formed on the first dielectric layer 130 and in the two openings OP1 and OP2, and then a lithographic etching process is performed on the metal material layer to form the first transfer electrode TE1 and the second transfer electrode TE2, but the disclosure is not limited thereto. Materials of the first transfer electrode TE1 and the second transfer electrode TE2 are, for example, a metal material, a nitride of a metal material, an oxide of a metal material, an oxynitride of a metal material, another suitable material, or a stacked layer of a metal material and another conductive material.

A second dielectric layer 132 is formed on the first transfer electrode TE1 and the second transfer electrode TE2. In this embodiment, the second dielectric layer 132 may cover the first transfer electrode TE1, the second transfer electrode TE2, and the first dielectric layer 130. The thickness of the second dielectric layer 132 is, for example, between 0.1 microns and 1.5 microns. In this embodiment, materials of the second dielectric layer 132 may include, for example, an inorganic material (for example, silicon oxide, silicon nitride, silicon oxynitride, another suitable material, or a stacked layer of at least two of the foregoing materials), an organic material, another suitable material, or a combination thereof, but the disclosure is not limited thereto.

A dielectric layer 134 is selectively formed on the second dielectric layer 132. The thickness of the dielectric layer 134 is, for example, between 0.1 microns and 1.5 microns. In this embodiment, materials of the dielectric layer 134 include, for example, an inorganic material (for example, silicon oxide, silicon nitride, silicon oxynitride, another suitable material, or a stacked layer of at least two of the foregoing materials), an organic material, another suitable material, or a combination thereof, but the disclosure is not limited thereto.

Figure 1D:
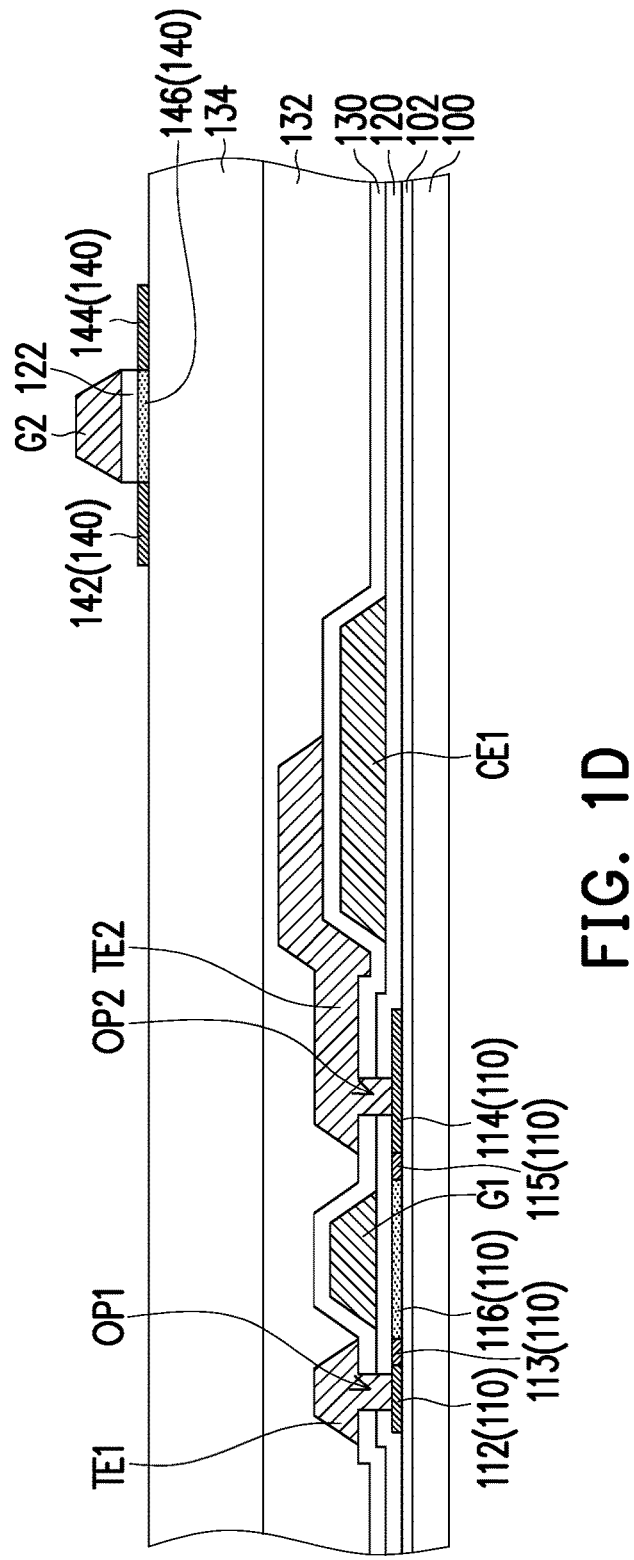

Referring to FIG. 1D, a metal oxide channel layer 140 is formed above the second dielectric layer 132. In this embodiment, the metal oxide channel layer 140 is formed on the dielectric layer 134. In this embodiment, the metal oxide channel layer 140 includes two conductive areas 142 and 144 and a semiconductor area 146 located between the two conductive areas 142 and 144. In another embodiment, the conductive areas 142 and 144 of the metal oxide channel layer 140 are each, for example, a conductor or a semiconductor.

A material of the metal oxide channel layer 140 is, for example, indium gallium zinc oxide (IGZO), indium zinc oxide, indium oxide, zinc oxide, indium titanium oxide, zinc titanium oxide, or the like, but the disclosure is not limited thereto. In this embodiment, for example, a doping process or a plasma treatment process (for example, a hydrogen plasma treatment process or another plasma treatment process) enables the conductive areas 142 and 144 and the semiconductor area 146 to have different electric conductivities, but the disclosure is not limited thereto.

A second gate G2 is formed above the substrate 100. In this embodiment, the second gate G2 is formed on the metal oxide channel layer 140. In this embodiment, a second insulating layer 122 is further sandwiched between the second gate G2 and the metal oxide channel layer 140. For example, the second gate G2 and the second insulating layer 122 are formed in a same patterning process. In this embodiment, for example, the second gate G2 and the second insulating layer 122 may serve as a mask for the plasma treatment process. In other words, an orthographic projection of the semiconductor area 146 of the metal oxide channel layer 140 on the substrate 100 and the orthographic projection of the second gate G2 on the substrate 100 have a same shape. In other embodiments, the second gate G2 and the second insulating layer 122 may alternatively be formed through different patterning processes. In other words, an orthographic projection of the second insulating layer 122 on the substrate 100 and the orthographic projection of the second gate G2 on the substrate 100 may have different shapes.

Figure 1E:
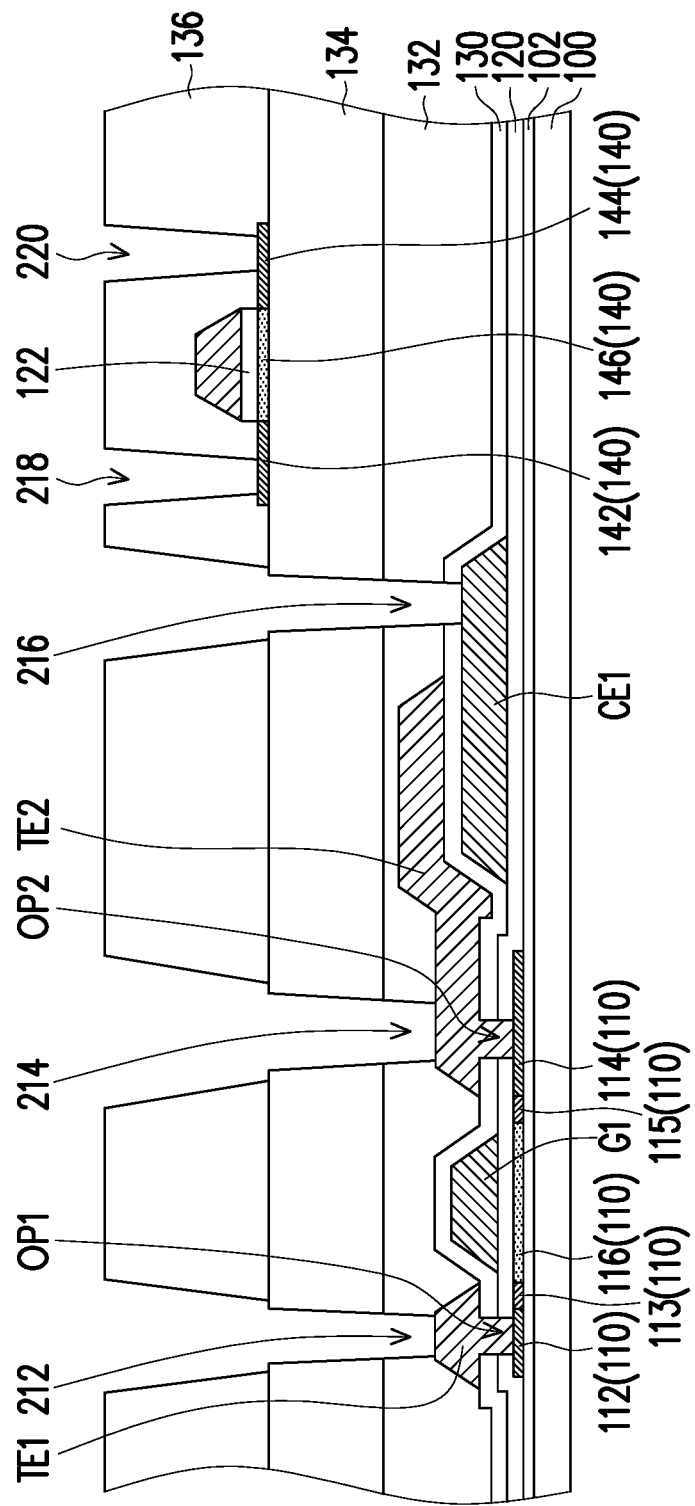

Referring to FIG. 1E, a third dielectric layer 136 is formed on the metal oxide channel layer 140. The third dielectric layer 136 may cover the second dielectric layer 132, the dielectric layer 134, the metal oxide channel layer 140, and the second gate G2. In this embodiment, the second gate G2 is located between the metal oxide channel layer 140 and the third dielectric layer 136.

In this embodiment, materials of the third dielectric layer 136 include, for example, an inorganic material (for example, silicon oxide, silicon nitride, silicon oxynitride, another suitable material, or a stacked layer of at least two of the foregoing materials), an organic material, another suitable material, or a combination thereof, but the disclosure is not limited thereto.

A second etching process is performed to form two first through-holes 212 and 214 penetrating through at least the second dielectric layer 132. In this embodiment, the second etching process is performed after the third dielectric layer 136 is formed, and the first through-holes 212 and 214 penetrate through the second dielectric layer 132, the dielectric layer 134, and the third dielectric layer 136. The first through-hole 212 exposes the first transfer electrode TE1, and the second through-hole 214 exposes the second transfer electrode TE2. In other embodiments, when the second gate G2 and the second insulating layer 122 may alternatively be formed through different patterning processes, an area of the second insulating layer 122 is greater than that of the second gate G2. In the second etching process, the first through-holes 212 and 214 may penetrate through the second dielectric layer 132, the dielectric layer 134, the second insulating layer 122, and the third dielectric layer 136.

In the second etching process, because an etching selection ratio of the dielectric layers (the second dielectric layer 132, the dielectric layer 134, and the third dielectric layer 136) and the first transfer electrode TE1 is high, and an etching selection ratio of the dielectric layers (the second dielectric layer 132, and the etching selection ratio of the dielectric layer 134, and the third dielectric layer 136) and the second transfer electrode TE2 is high, the first transfer electrode TE1 and the second transfer electrode TE2 may serve as etch stop layers of the first through-holes 212 and 214 respectively.

Based on the foregoing, because the first transfer electrode TE1 and the second transfer electrode TE2 that may serve as the etch stop layers are provided, the silicon layer 110 is not damaged in the second etching process even if in the second etching process, the second dielectric layer 132, the dielectric layer 134, and the third dielectric layer 136 that have a relatively large thickness need to be etched. In other words, the second etching process may have a relatively large etching margin.

In this embodiment, during the second etching process, a second through-hole 216 penetrating through at least the first dielectric layer 130 and the second dielectric layer 132 may further be formed. In this embodiment, the second through-hole 216 further penetrates through the dielectric layer 134 and the third dielectric layer 136. The second through-hole 216 exposes the capacitive electrode CE1.

In this embodiment, because an etching selection ratio of the dielectric layers (the first dielectric layer 130, the second dielectric layer 132, the dielectric layer 134, and the third dielectric layer 136) and the capacitive electrode CE1 is high, the capacitive electrode CE1 may serve as the etch stop layer of the second through-hole 216.

In this embodiment, during the second etching process, two third through-holes 218 and 220 penetrating through the third dielectric layer 136 may further be formed. The third through-hole 218 overlaps the conductive area 142 of the metal oxide channel layer 140. The third through-hole 220 overlaps the conductive area 144 of the metal oxide channel layer 140. In other words, the third through-hole 218 exposes the conductive area 142 of the metal oxide channel layer 140, and the third through-hole 220 exposes the conductive area 144 of the metal oxide channel layer 140.

Although in this embodiment, the third dielectric layer 136 is formed first and the second etching process is performed next to form the first through-holes 212 and 214, the disclosure is not limited thereto. In other embodiments, the second etching process is performed first, the third dielectric layer 136 is then formed, and the through-hole is formed next in the third dielectric layer 136.

Figure 1F:
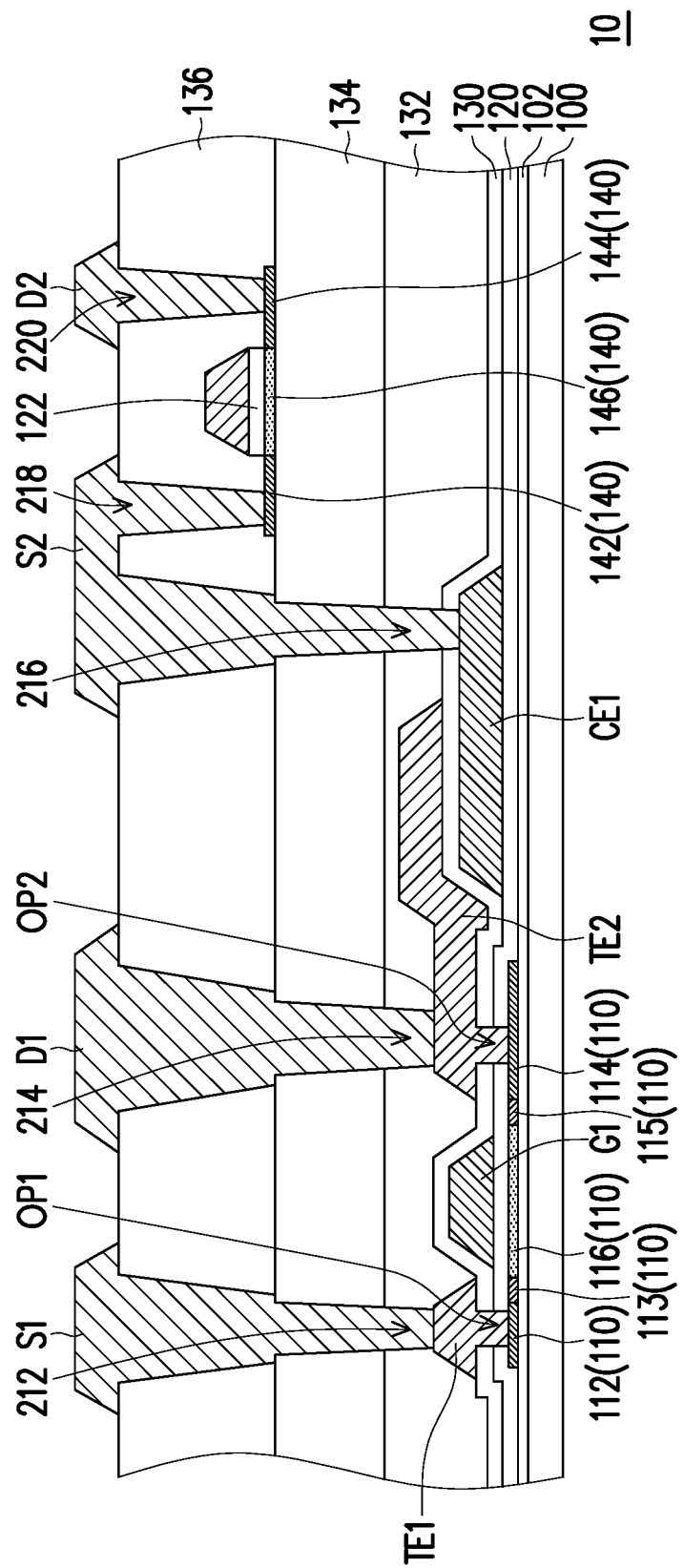

Referring to FIG. 1F, the first source S1 and the first drain D1 are formed in the first through-holes 212 and 214 respectively. In this embodiment, the first source S1 and the first drain D1 are formed on the third dielectric layer 136. The first source S1 is formed in the first through-hole 212, and the first drain D1 is formed in the first through-hole 214. In this embodiment, the first source S1 is directly connected to the first transfer electrode TE1 and is electrically connected to the silicon layer 110 through the first transfer electrode TE1, and the first drain D1 is directly connected to the second transfer electrode TE2 and is electrically connected to the silicon layer 110 through the second transfer electrode TE2.

The second source S2 and the second drain D2 are formed on the metal oxide channel layer 140. In this embodiment, the second source S2 and the second drain D2 are formed on the third dielectric layer 136. The second source S2 is formed in the second through-hole 216 and the third through-hole 218, and the second drain D2 is formed in the third through-hole 220. In this embodiment, the second source S2 and the second drain D2 are electrically connected to the metal oxide channel layer 140 through the third through-hole 218 and the third through-hole 220 respectively. The second source S2 is electrically connected to the capacitive electrode CE1 through the second through-hole 216.

In this embodiment, the first source S1, the first drain D1, the second source S2, and the second drain D2 belong to a same film layer. For example, an electrode material layer (not shown) may first be formed above the third dielectric layer 136. Next, a lithographic etching process is performed on the electrode material layer to form the first source S1, the first drain D1, the second source S2, and the second drain D2. Materials of the first source S1, the first drain D1, the second source S2 and the second drain D2 are, for example, a metal material, a nitride of a metal material, an oxide of a metal material, an oxynitride of a metal material, another suitable material, or a stacked layer of a metal material and another conductive material, but the disclosure is not limited thereto.

In this embodiment, a first active device includes the first source S1, a first drain D1, the first transfer electrode TE1, the second transfer electrode TE2, the first gate G1, and the silicon layer 110. Moreover, the first active device exhibits high electron mobility and high reliability. A second active device includes the second source S2, the second drain D2, the second gate G2, and the metal oxide channel layer 140. Further, the second active device exhibits low leakage.

At this point, the active device substrate 10 in this embodiment is almost completed.

Figure 1G:
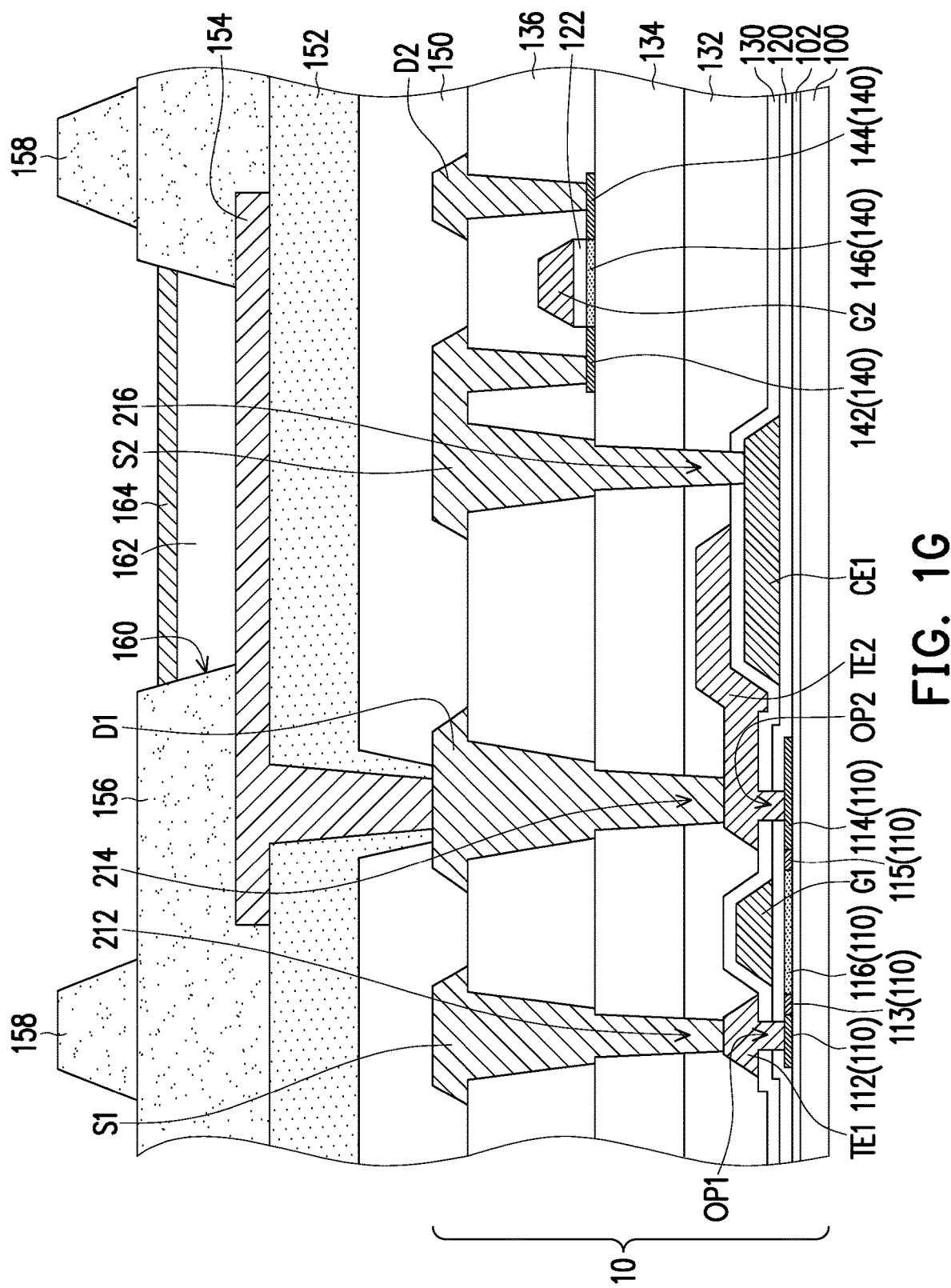

Referring to FIG. 1G, a passivation layer 150 is formed on the third dielectric layer 136. A planarization layer 152 is formed on the passivation layer 150. The passivation layer 150 covers the first source S1, the first drain D1, the second source S2 and the second drain D2.

A first electrode 154 is formed on the planarization layer 152. The first electrode 154 is electrically connected to the first drain D1. A pixel definition layer 156 is formed on the planarization layer 152, and a spacer 158 is formed on the pixel definition layer 156. In this embodiment, the pixel definition layer 156 has an opening 160 exposing the first electrode 154. A light emitting layer 162 is formed in the opening 160. A second electrode 164 is formed on the light emitting layer 162.

At this point, the manufacturing of a display apparatus 1 is almost completed. In this embodiment, the display apparatus 1 is an organic light emitting diode display apparatus, but the disclosure is not limited thereto. In other embodiments, the active device substrate 10 is applicable to other electronic devices, for example, a liquid crystal display apparatus, a micro LED display apparatus, or another electronic apparatus.

It should be noted herein that reference numerals and some contents of the devices in the following embodiments are continuously used in the foregoing embodiment. Same reference numerals are used to represent the same or similar devices, and descriptions of the same technical contents are omitted. For the omitted descriptions, refer to the foregoing embodiment. In the following embodiments, details are not provided again.

Figure 2:
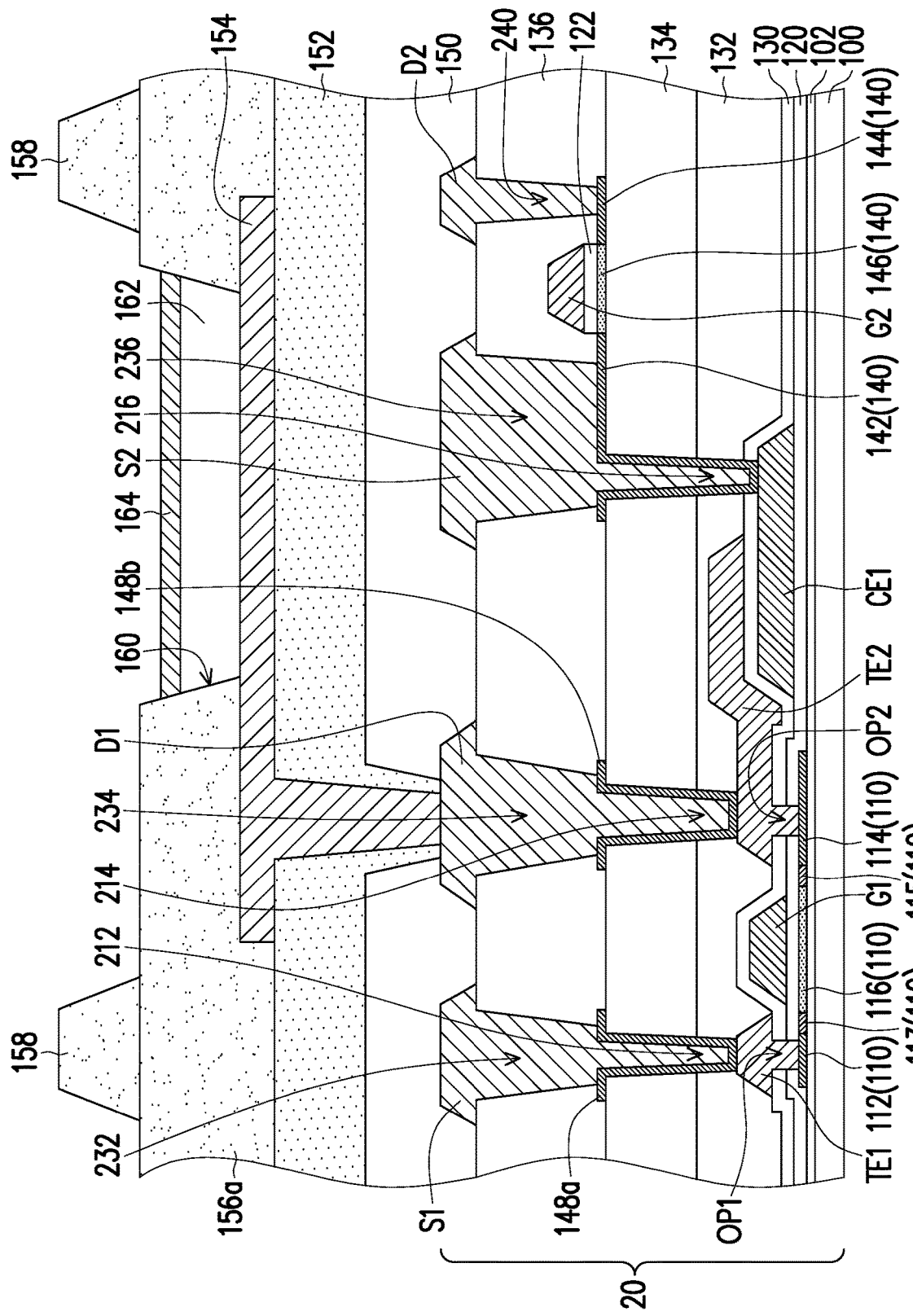
FIG. 2 is a schematic cross-sectional view of a display apparatus according to another embodiment of the disclosure.

FIG. 2 is a schematic cross-sectional view of a display apparatus according to another embodiment of the disclosure.

Referring to FIG. 2 and FIG. 1G, a difference between a display apparatus 2 and the display apparatus 1 is that an active device substrate 20 of the display apparatus 2 includes guard electrodes 148a and 148b.

In this embodiment, before the third dielectric layer 136 is formed, a second etching process is performed to form the first through-holes 212 and 214 and the second through-hole 216. The first through-holes 212 and 214 penetrate through the second dielectric layer 132 and the dielectric layer 134. The second through-hole 216 penetrates through the first dielectric layer 130, the second dielectric layer 132, and the dielectric layer 134.

Next, the guard electrodes 148a and 148b are formed in the first through-holes 212 and 214 respectively, and a part of the metal oxide channel layer 140 is formed in the second through-hole 216.

In this embodiment, the guard electrodes 148a and 148b and the metal oxide channel layer 140 belong to a same film layer. In other words, the guard electrodes 148a and 148b and the metal oxide channel layer 140 are formed in a same process step. In this embodiment, conductive areas 142 and 144 of the guard electrodes 148a and 148b and the metal oxide channel layer 140 have similar electric conductivities, but the disclosure is not limited thereto.

A second insulating layer 122 and a second gate G2 are formed on the metal oxide channel layer 140.

After the third dielectric layer 136 is formed, a third etching process is performed to form four third holes 232, 234, 236, and 240 penetrating through the third dielectric layer 136. The third through-holes 232 and 234 expose the guard electrode 148a and 148b respectively, and the third through-holes 236 and 240 expose the conductive areas 142 and 144 of the metal oxide channel layer 140 respectively.

The first source S1, the first drain D1, the second source S2, and the second drain D2 are formed on the third dielectric layer 136. In this embodiment, the first source S1 is located in the third through-hole 232, and is electrically connected to a first transfer electrode TE1 through the guard electrode 148a located in first through-hole 212. The first drain D1 is located in the third through-hole 234 and is electrically connected to a second transfer electrode TE2 through the guard electrode 148b located in first through-hole 214. The second source S2 is located in the third through-hole 236, and is electrically connected to a capacitive electrode CE1 through the part of the metal oxide channel layer 140 located in the second through-hole 216.

In this embodiment, the guard electrodes 148a and 148b and the metal oxide channel layer 140 may prevent surfaces of the first transfer electrode TE1, the second transfer electrode TE2, and the capacitive electrode CE1 from being damaged, thereby increasing a yield of the active device substrate 20.

Figure 3:
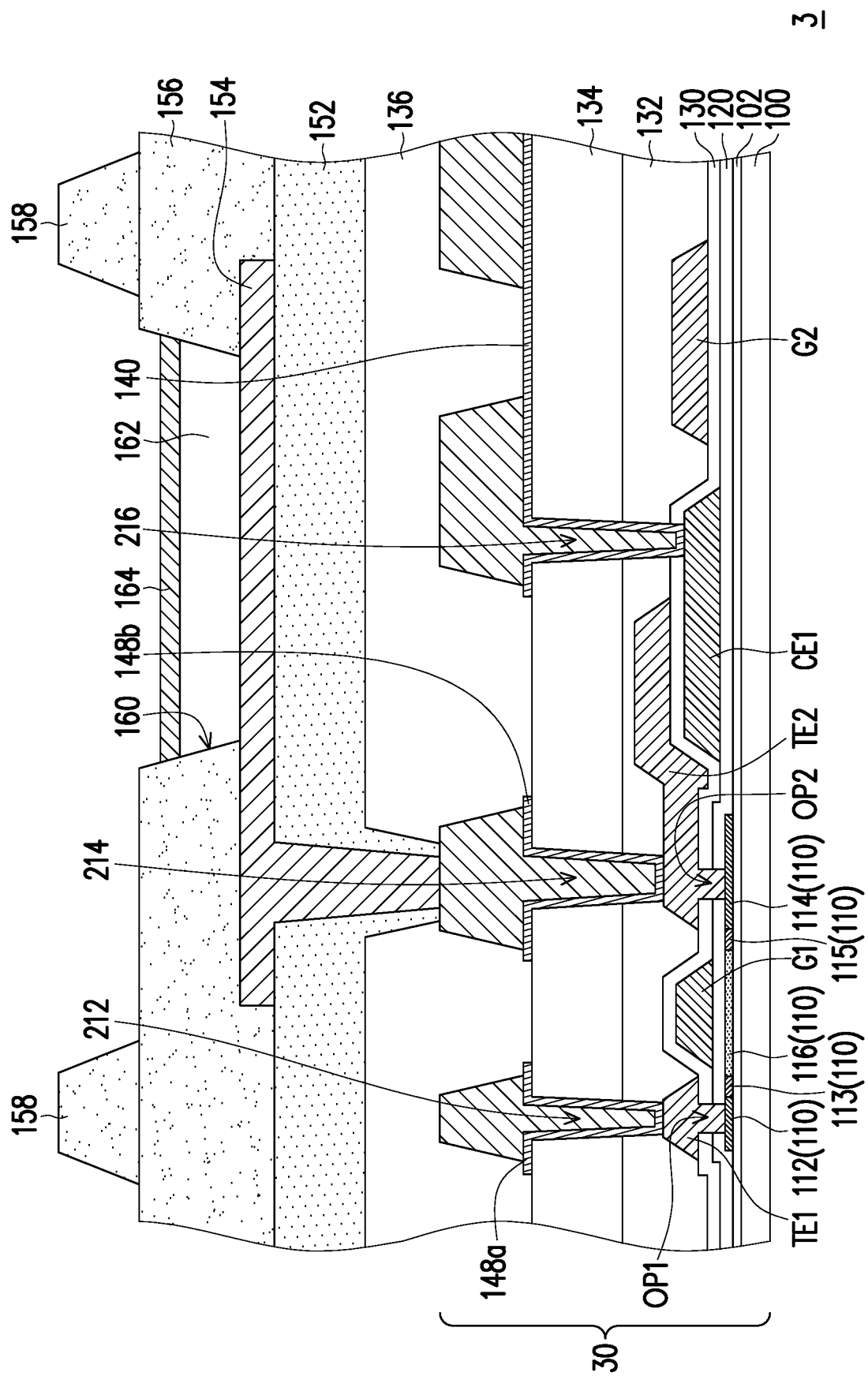
FIG. 3 is a schematic cross-sectional view of a display apparatus according to still another embodiment of the disclosure.

FIG. 3 is a schematic cross-sectional view of a display apparatus according to still another embodiment of the disclosure.

Referring to FIG. 3 and FIG. 2, a difference between a display apparatus 3 and the display apparatus 2 is that a second gate G2 of an active device substrate 30 of the display apparatus 3 is located between a metal oxide channel layer 140 and a substrate 100.

In this embodiment, the second gate G2 is located above the substrate 100 and is located between a first dielectric layer 130 and a second dielectric layer 132. That is, the second gate G2, the first transfer electrode TE1, and the second transfer electrode TE2 in this embodiment are completed in a same process step, but the disclosure is not limited thereto. In other embodiments, the second gate G2 is located between the first dielectric layer 130 and a first insulating layer 120.

In this way, the process of the active device substrate 30 in this embodiment may be simplified.

FIG. 4A to FIG. 4E are schematic cross-sectional views of a manufacturing method of a display apparatus according to still another embodiment of the disclosure.

Figure 4A:
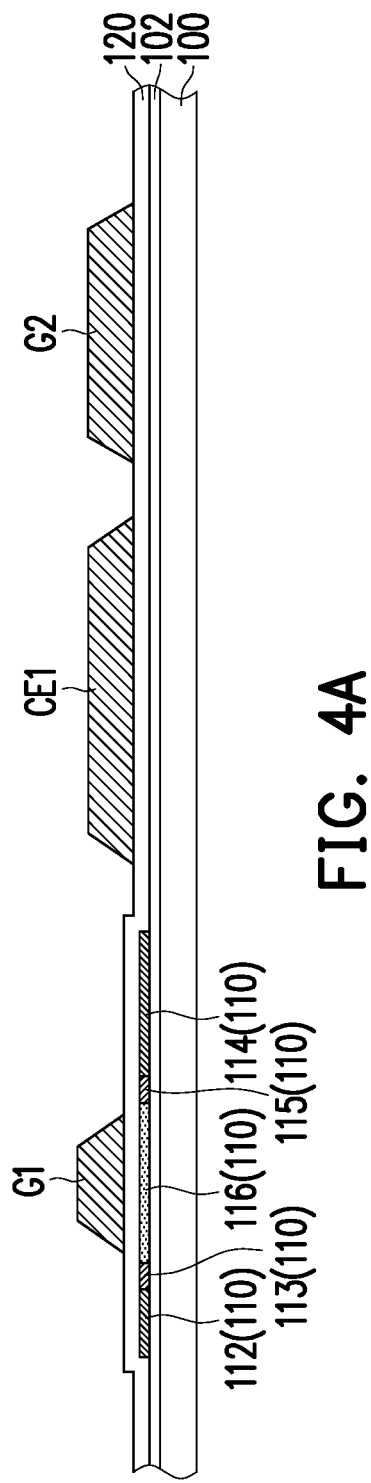
FIG. 4A to FIG. 4E are schematic cross-sectional views of a manufacturing method of a display apparatus according to still another embodiment of the disclosure.

Referring to FIG. 4A, a substrate 100 is provided. An insulating layer 102 is formed on the substrate 100. A silicon layer 110 is formed on the insulating layer 102. A first insulating layer 120 is formed on the silicon layer 110.

A first gate G1, a capacitive electrode CE1, and a second gate G2 are formed on the first insulating layer 120. An orthographic projection of the first gate G1 on the substrate 100 overlaps an orthographic projection of the silicon layer 110 on the substrate 100, and does not overlap an orthographic projection of the capacitive electrode CE1 on the substrate 100 and an orthographic projection of the second gate G2 on the substrate 100.

In this embodiment, the first gate G1, the capacitive electrode CE1, and the second gate G2 belong to a same film layer. For example, a metal material layer (not shown) may be first formed on the first insulating layer 120, and then a lithographic etching process is performed on the metal material layer to form the first gate G1, the capacitive electrode CE1, and the second gate G2, but the disclosure is not limited thereto.

Figure 4B:
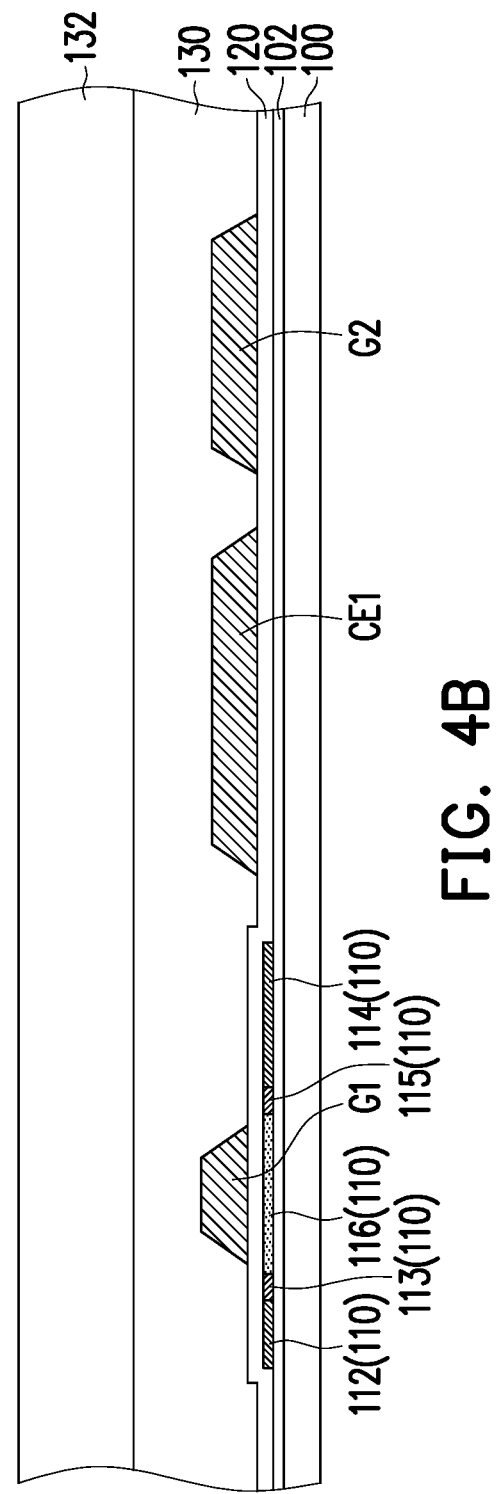

Referring to FIG. 4B, a first dielectric layer 130 is formed on the first gate G1. The first dielectric layer 130 may cover the first gate G1, the capacitive electrode CE1, the second gate G2, and the first insulating layer 120. The first gate G1, the capacitive electrode CE1, and the second gate G2 are located between the first insulating layer 120 and the first dielectric layer 130. Optionally, a second dielectric layer 132 is formed to cover the first dielectric layer 130.

Figure 4C:
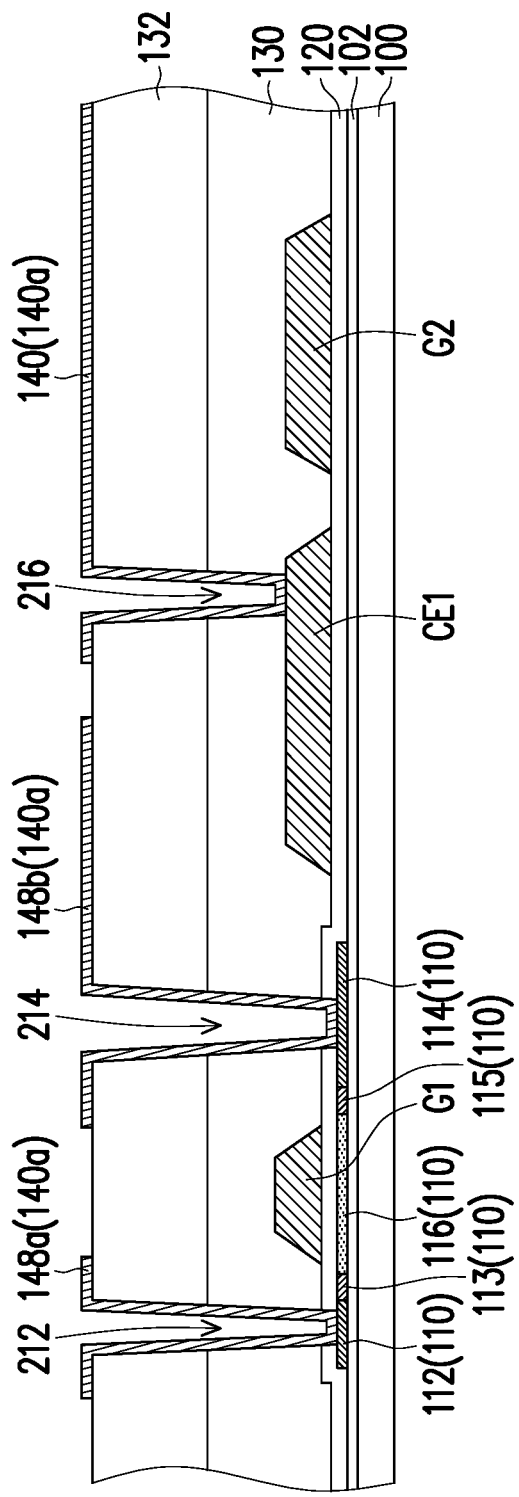

Referring to FIG. 4C, a first etching process is performed to form two first through-holes 212 and 214 penetrating through at least the first dielectric layer 130. The first through-holes 212 and 214 expose the silicon layer 110. In this embodiment, the first through-holes 212 and 214 penetrate through the first insulating layer 120, the first dielectric layer 130, and the second dielectric layer 132. The first through-hole 212 exposes a doped area 112 of the silicon layer 110, and the second through-hole 214 exposes a doped area 114 of the silicon layer 110.

In the first etching process, a second through-hole 216 penetrating through the first dielectric layer 130 and the second dielectric layer 132 may further be formed. Because an etching selection ratio of the capacitive electrode CE1 is high, the capacitive electrode CE1 may be an etch stop layer of the second through-hole 216. Herein, the second through-hole 216 exposes the capacitive electrode CE1.

An oxide layer 140a is formed above the first dielectric layer 130. In this embodiment, the second dielectric layer 132 is located between the first dielectric layer 130 and the oxide layer 140a, and the oxide layer 140 is formed on the second dielectric layer 132. The oxide layer 140a includes guard electrodes 148a and 148b and a metal oxide channel layer 140 separated from the guard electrodes 148a and 148b.

The guard electrode 148a is filled in the first through-hole 212 and is connected to the doped area 112 of the silicon layer 110. The guard electrode 148b is filled in the first through-hole 214, and is connected to the doped area 114 of the silicon layer 110. The metal oxide channel layer 140 is filled in the second through-hole 216, and is connected to the capacitive electrode CE1. In this embodiment, the orthographic projection of the second gate G2 on the substrate 100 overlaps an orthographic projection of the oxide channel layer 140 on the substrate 100.

In this embodiment, a part of the first dielectric layer 130 and a part of the second dielectric layer 132 are located between the guard electrode 148b and the capacitive electrode CE1. Therefore, there is a capacitor (for example, a storage capacitor) between the guard electrode 148b and the capacitive electrode CE1.

Figure 4D:
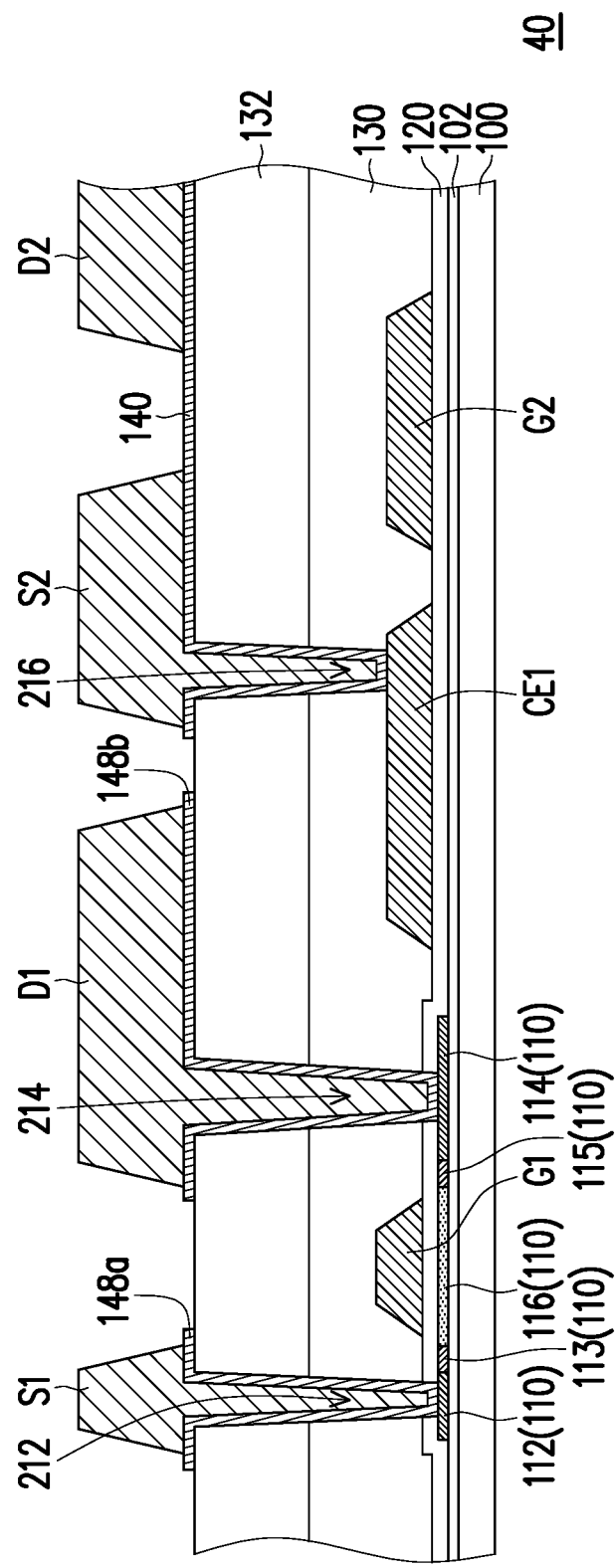

Referring to FIG. 4D, a first source S1, a first drain D1, a second source S2 and a second drain D2 are formed on the oxide layer 140a. In this embodiment, the first source S1 and the first drain D1 are formed on the guard electrodes 148a and 148b, and the second source S2 and the second drain D2 are formed on the metal oxide channel layer 140. The first source S1 is located in the first through-hole 212, and is electrically connected to the silicon layer 110 through the guard electrode 148a. The first drain D1 is located in the first through-hole 214, and is electrically connected to the silicon layer 110 through the guard electrode 148b. In this embodiment, the capacitive electrode CE1 overlaps the first drain D1. The second source S2 is located in the second through-hole 216 and is electrically connected to the capacitive electrode CE1 through the metal oxide channel layer 140. For example, a part of the metal oxide channel layer 140 is filled in the second through-hole 216, and is connected to the second source S2 and the capacitive electrode CE1.

The second source S2 and the second drain D2 are directly connected to the metal oxide channel layer 140.

At this point, the active device substrate 40 in this embodiment is almost completed.

Figure 4E:
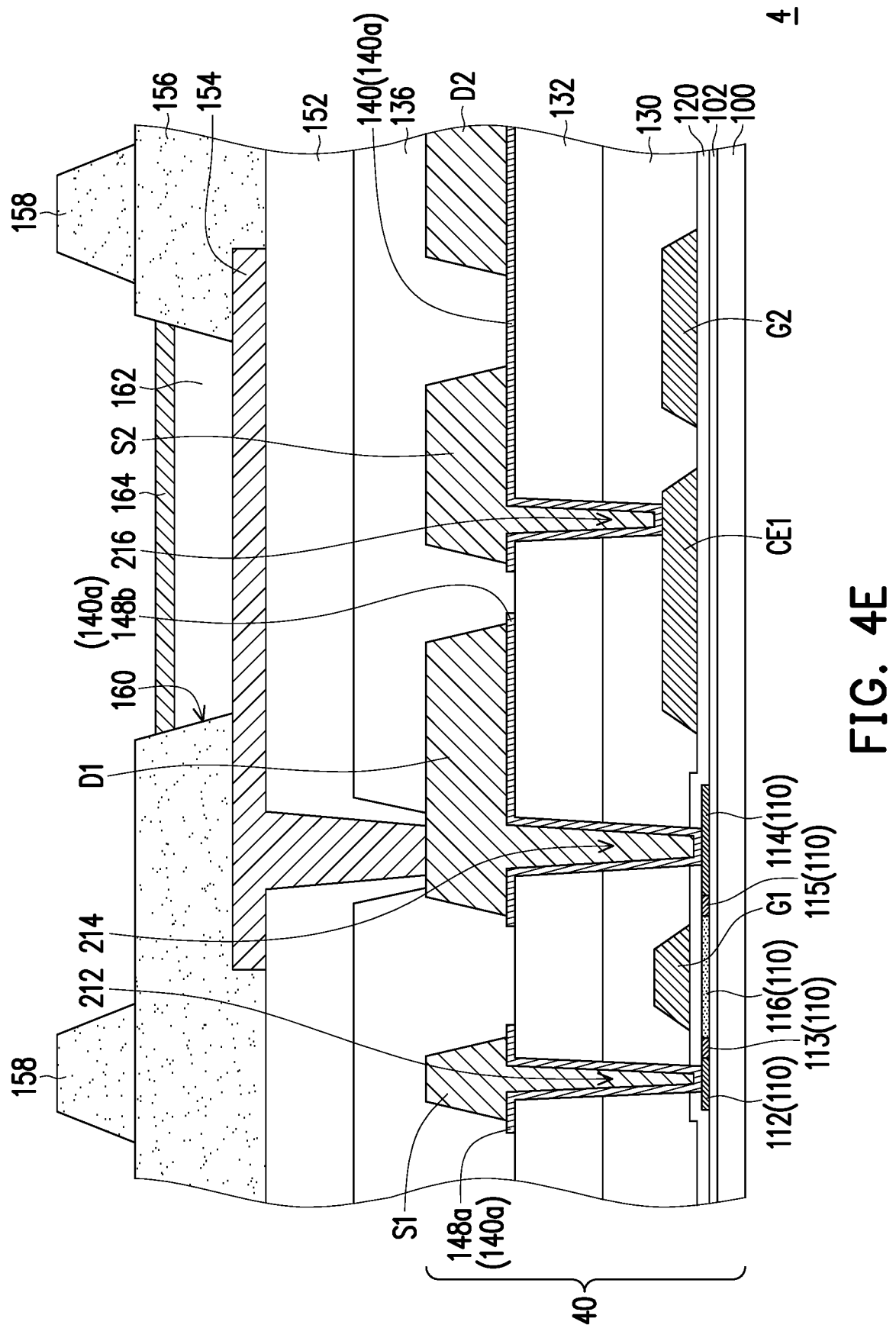

Referring to FIG. 4E, a third dielectric layer 136 is formed to cover the first source S1, the first drain D1, the second source S2, the second drain D2, and the oxide layer 140a. A planarization layer 152 is formed on the third dielectric layer 136.

Still referring to FIG. 4E, subsequently, a display apparatus 4 may be manufactured by stacking a first electrode 154, a pixel definition layer 156, a spacer 158, a light emitting layer 162, and a second electrode 164 on the active device substrate 40.

FIG. 5A to FIG. 5E are schematic cross-sectional views of a manufacturing method of a display apparatus according to still another embodiment of the disclosure.

Figure 5A:
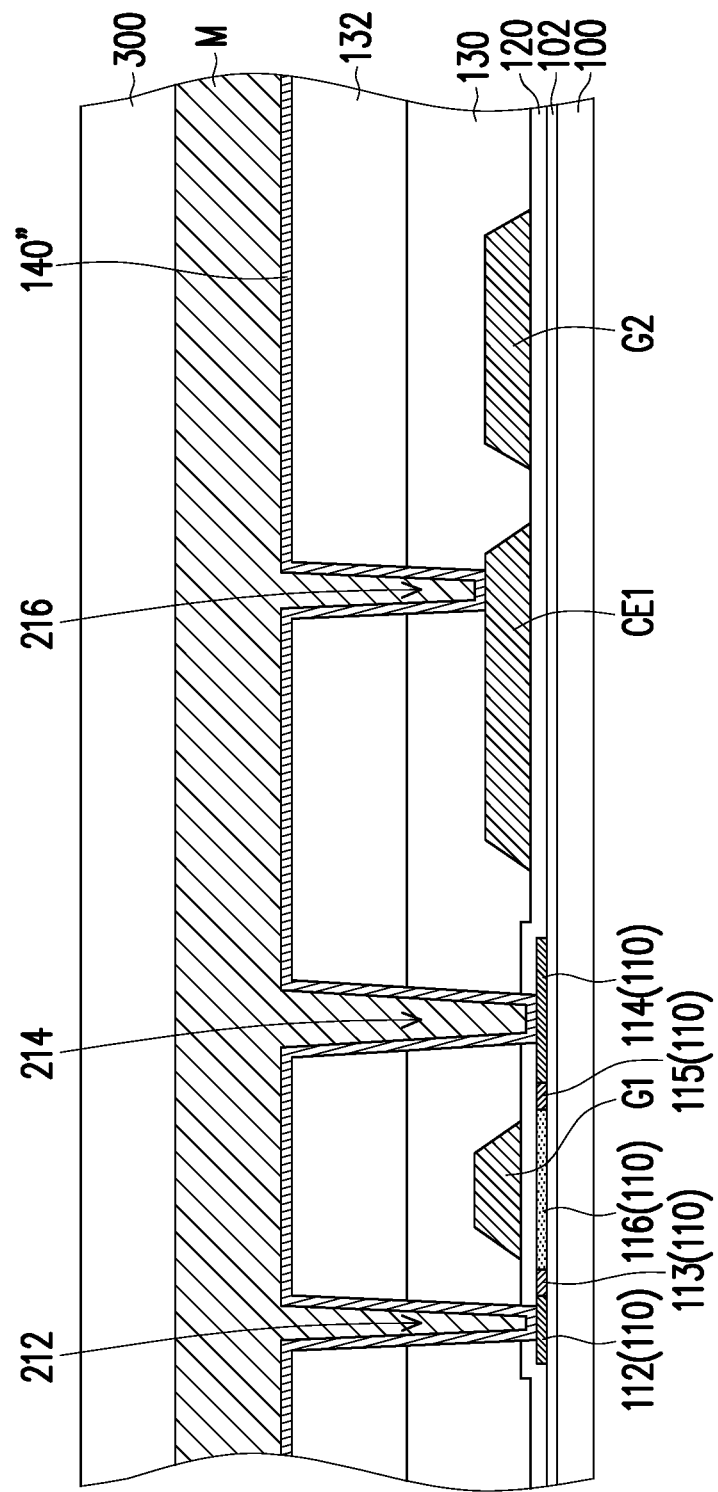
FIG. 5A to FIG. 5E are schematic cross-sectional views of a manufacturing method of a display apparatus according to still another embodiment of the disclosure.

FIG. 5A follows the steps of FIG. 4B. Referring to FIG. 5A, a first etching process is performed to form two first through-holes 212 and 214 penetrating through at least the first dielectric layer 130. The two first through-holes 212 and 214 expose the silicon layer 110. In this embodiment, the first through-holes 212 and 214 penetrate through the first insulating layer 120, the first dielectric layer 130, and the second dielectric layer 132. The first through-hole 212 exposes a doped area 112 of the silicon layer 110, and the second through-hole 214 exposes a doped area 114 of the silicon layer 110. In this step, a second through-hole 216 penetrating through at least the first dielectric layer 130 and the second dielectric layer 132 may simultaneously be formed, and the capacitive electrode CE1 may be an etch stop layer of the second through-hole 216. Herein, the second through-hole 216 exposes the capacitive electrode CE1.

Still referring to FIG. 5A, an oxide material layer 140" is formed above the first dielectric layer 130. A metal material layer M is formed on the oxide material layer 140", and a photoresist layer 300 is formed on the metal material layer M.

Figure 5B:
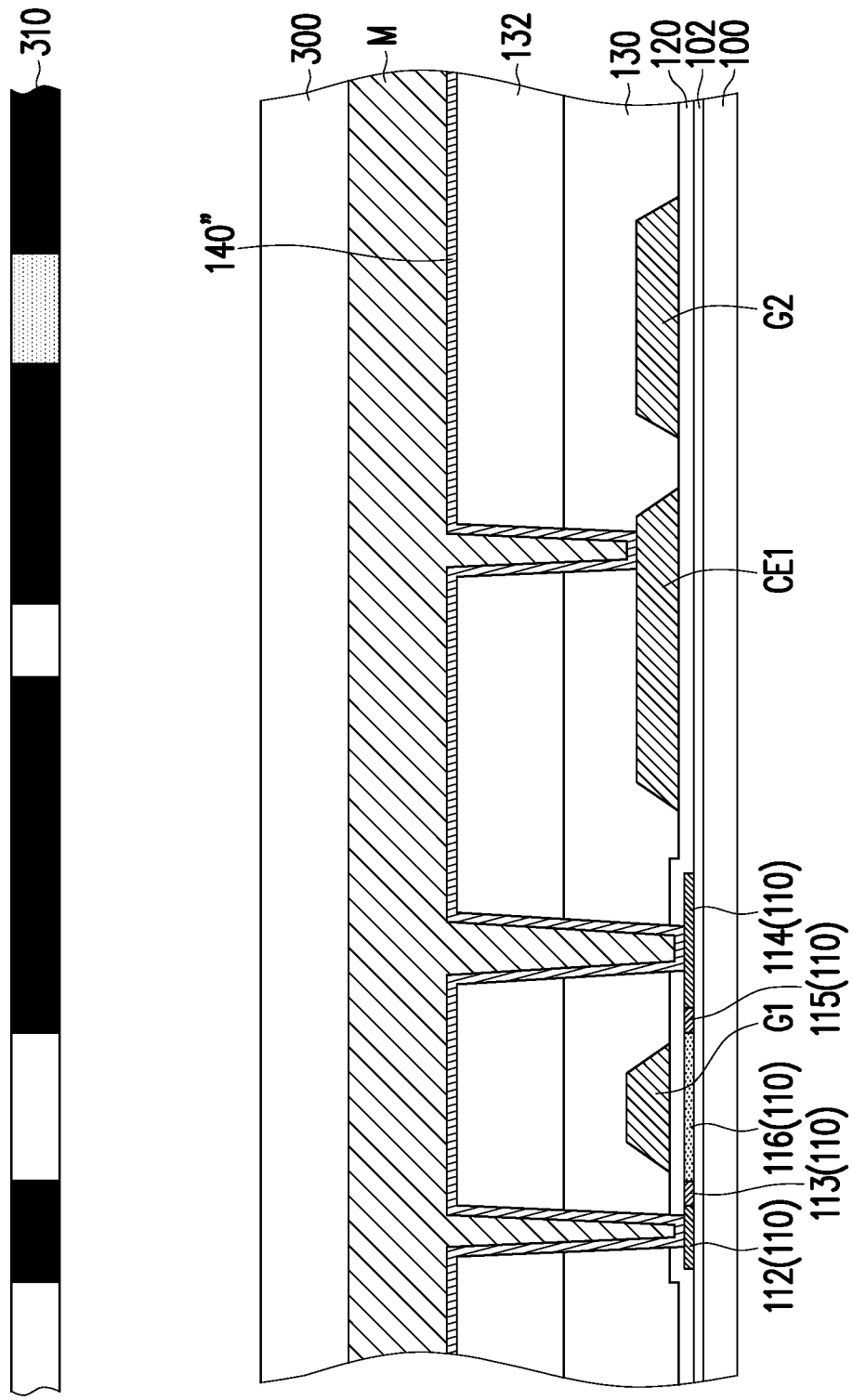
Figure 5C:
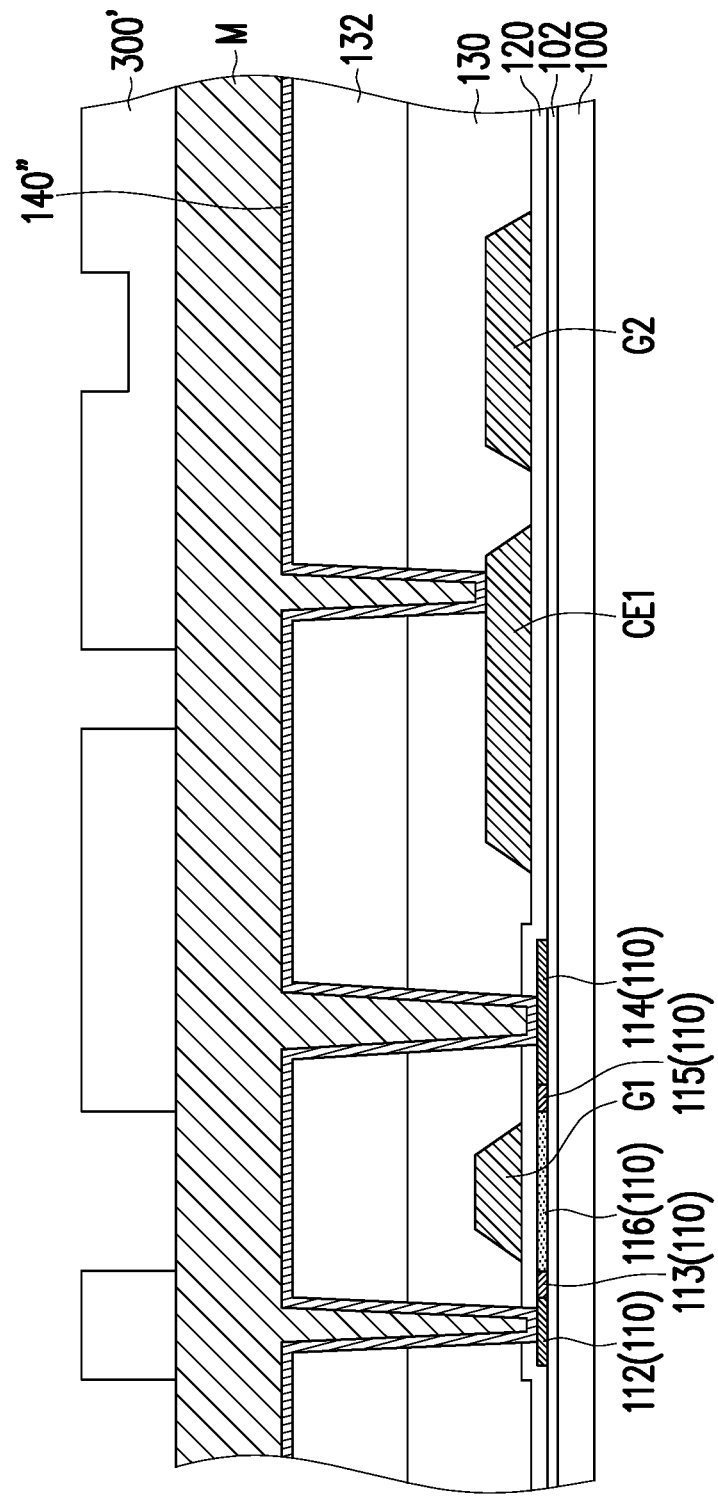
Figure 5D:
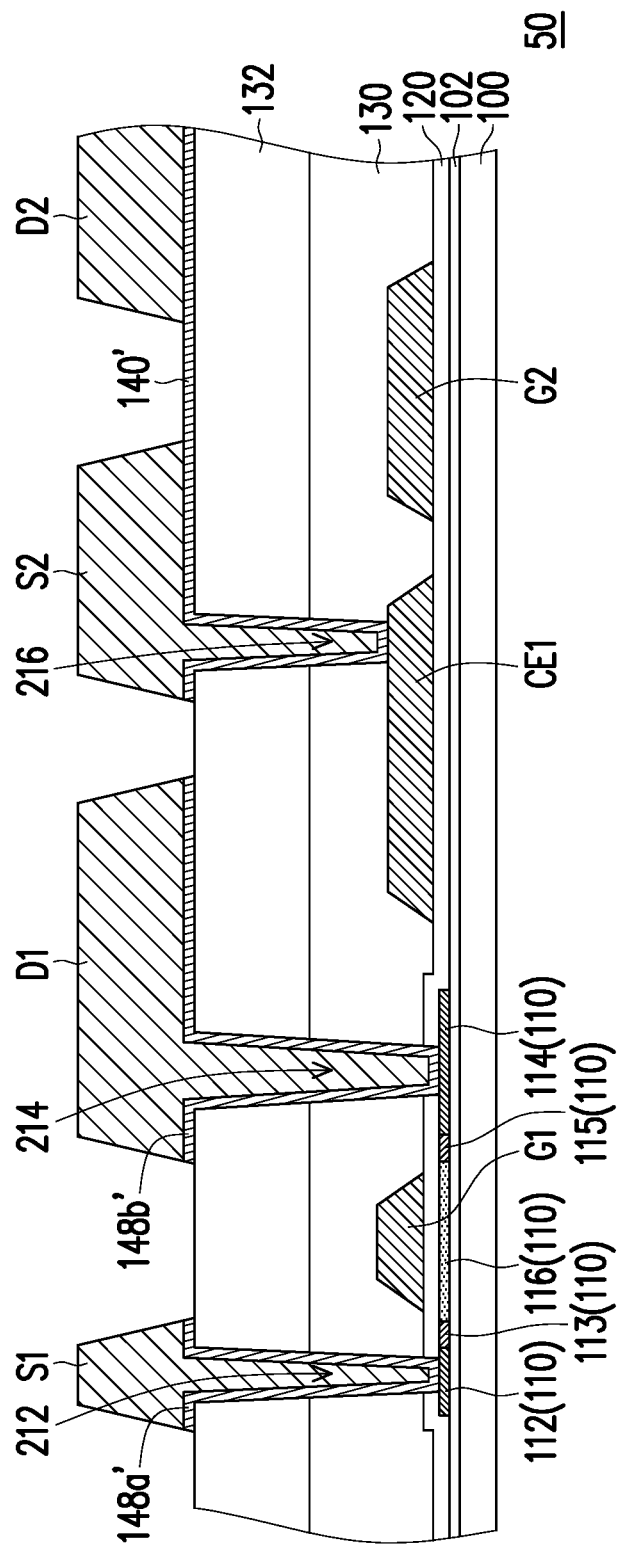

Referring to FIG. 5B to FIG. 5D, a half-tone mask 310 is provided to perform a lithographic etching process.

The photoresist layer 300 is patterned by using the half-tone mask 310 as a shield to form a patterned photoresist layer 300'. In this embodiment, the patterned photoresist layer 300' includes areas having different thicknesses.

Next, an etching process is performed by using the patterned photoresist layer 300 as a mask to remove a part of the metal material layer M and a part of the oxide material layer 140".

Two guard electrodes 148a' and 148b', a metal oxide channel layer 140', a first source S1, a first drain D1, a second source S2, and a second drain D2 are synchronously formed. In this way, process steps and required masks may effectively be reduced, so that the process is simplified. In this embodiment, because a location that is between the second source S2 and the second drain D2 and that corresponds to metal material layer M overlaps a part of the patterned photoresist layers 300', between the second source S2 and the second drain D2, the metal oxide channel layer 140' corresponding to the part of the patterned photoresist layers 300' may remain after the etching process.

In this embodiment, a sidewall of the guard electrode 148a located outside the first through-hole 212 is aligned with a sidewall of the first source S1, and a sidewall of the guard electrode 148a located outside the first through-hole 214 is aligned with a sidewall of the first drain D1. In this embodiment, some sidewalls of the second source S2 and some sidewalls of the second drain D2 are aligned with sidewalls of the metal oxide channel layer 140'.

At this point, the active device substrate 50 is almost completed.

Figure 5E:
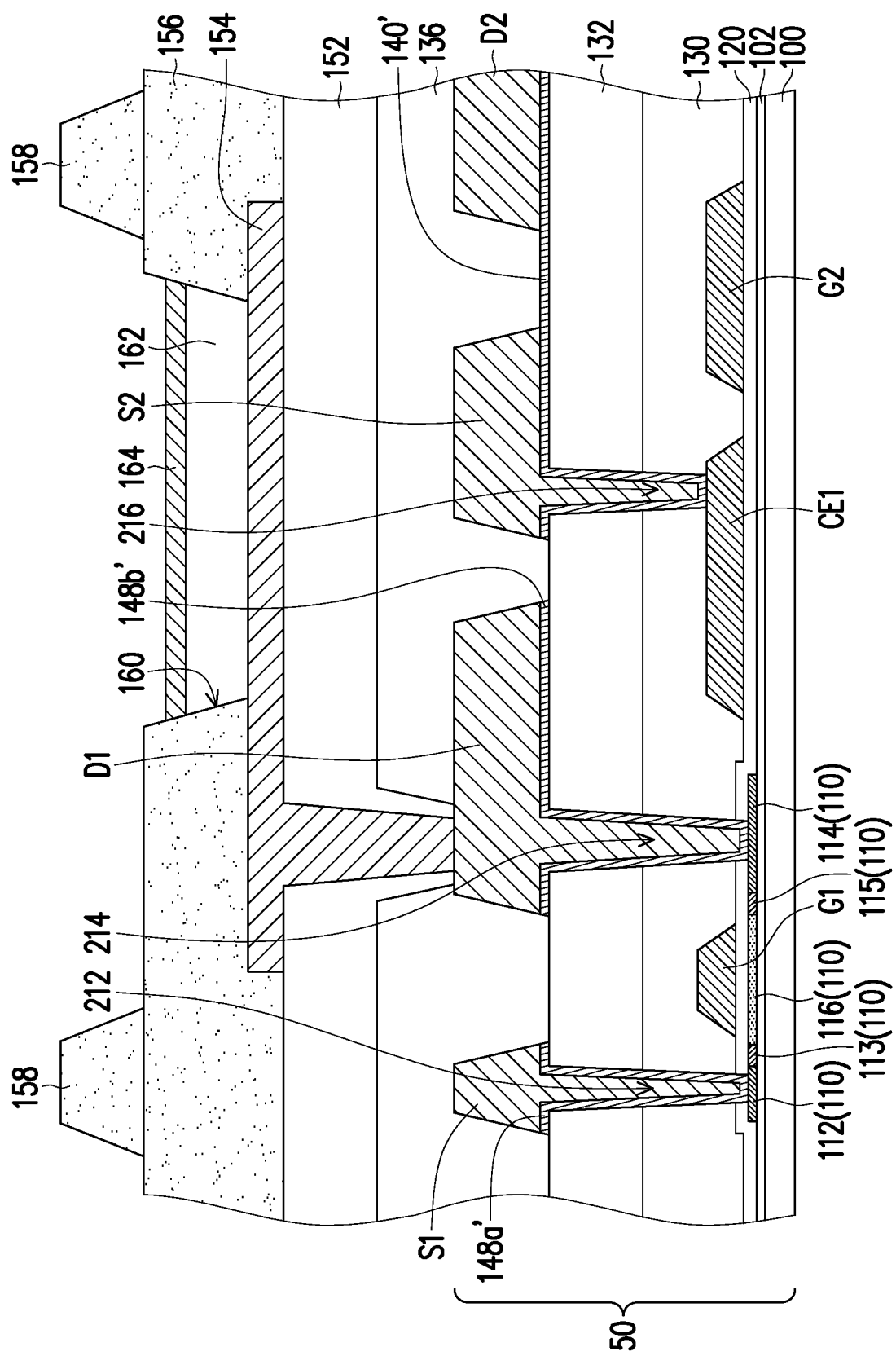

Referring to FIG. 5E, the third dielectric layer 136 is formed to cover a first source S1, a first drain D1, a second source S2, a second drain D2, and the second dielectric layer 132. A planarization layer 152 is formed on the third dielectric layer 136.

Next, the first electrode 154, the pixel definition layer 156, the spacer 158, the light emitting layer 162, and the second electrode 164 may be sequentially formed to complete the manufacturing of the display apparatus 5.

Based on the foregoing, the active device substrate of the disclosure can alleviate a problem of a poor yield of the silicon layer due to over-etching.

Although the disclosure has been disclosed above by using implementations, the implementations are not intended to limit the disclosure. Any person of ordinary skill in the art may make changes and modifications without departing from the spirit and scope of the disclosure. Therefore, the protection scope of the disclosure should be subject to the patent scope of the appended claims.

What is claimed is:

1. An active device substrate, comprising:
   a substrate;
   a silicon layer, located on the substrate;
   a first insulating layer, located on the silicon layer;
   a first gate, located on the first insulating layer;
   a first dielectric layer, located on the first gate, wherein two openings penetrate through at least the first dielectric layer, and the two openings overlap the silicon layer;
   a first transfer electrode and a second transfer electrode, respectively located in the two openings, wherein the first transfer electrode and the second transfer electrode are respectively connected to the silicon layer;
   a second dielectric layer, located on the first transfer electrode and the second transfer electrode, wherein two first through-holes penetrate through at least the second dielectric layer, and the first transfer electrode and the second transfer electrode are etch stop layers of the two first through-holes;
   a metal oxide channel layer, located above the second dielectric layer;
   a second gate overlapping the metal oxide channel layer; and
   a first source, a first drain, a second source, and a second drain, wherein the first source and the first drain are located in the two first through-holes, and the first source and the first drain are electrically connected to the first transfer electrode and the second transfer electrode respectively, wherein the second source and the second drain are electrically connected to the metal oxide channel layer.

2. The active device substrate according to claim 1, wherein the two openings penetrate through the first insulating layer, and a thickness of the first insulating layer ranges from 10 nm to 200 nm.

3. The active device substrate according to claim 1, wherein a thickness of the first dielectric layer ranges from 10 mu to 500 nm.

4. The active device substrate according to claim 1, further comprising:
   two guard electrodes located in the two first through-holes, wherein the two guard electrodes are connected to the first transfer electrode and the second transfer electrode respectively.

5. The active device substrate according to claim 4, wherein the two guard electrodes and the metal oxide channel layer belong to a same film layer.

6. The active device substrate according to claim 1, further comprising:

a capacitive electrode located on the first insulating layer, and overlapping the second transfer electrode, wherein the second source is electrically connected to the capacitive electrode through a second through-hole, and the second through-hole penetrates through at least the first dielectric layer and the second dielectric layer.

7. The active device substrate according to claim 6, wherein a part of the metal oxide channel layer is located in the second through-hole.

8. The active device substrate according to claim 1, wherein the second gate is located between the metal oxide channel layer and the substrate.

9. The active device substrate according to claim 1, further comprising:
   a third dielectric layer located on the metal oxide channel layer, wherein the second gate is located between the metal oxide channel layer and the third dielectric layer.

10. The active device substrate according to claim 1, further comprising:
    a third dielectric layer located on the metal oxide channel layer, wherein two third through-holes penetrate through at least the third dielectric layer, and the two first through-holes further penetrate through the third dielectric layer, wherein the second source and second drain are located in the two third through-holes.

11. A manufacturing method of an active device substrate, comprising:
    forming a silicon layer on a substrate;
    forming a first insulating layer on the silicon layer;
    forming a first gate on the first insulating layer;
    forming a first dielectric layer on the first gate;
    performing a first etching process to form two openings penetrating through at least the first dielectric layer, wherein the two openings are overlapping with the silicon layer;
    forming a first transfer electrode and a second transfer electrode in the two openings to respectively connect the silicon layer;
    foaming a second dielectric layer on the first transfer electrode and the second transfer electrode;
    performing a second etching process to form two first through-holes penetrating through at least the second dielectric layer, wherein the first transfer electrode and the second transfer electrode are etch stop layers of the two first through-holes;
    forming a metal oxide channel layer above the second dielectric layer;
    forming a second gate above the substrate and overlapping with the metal oxide channel layer;
    forming a first source and a first drain in the two first through-holes respectively, wherein the first source and the first drain are electrically connected to the first transfer electrode and the second transfer electrode respectively; and
    forming a second source and a second drain on the metal oxide channel layer, wherein the second source and the second drain are electrically connected to the metal oxide channel layer.

* * * * *